METHOD OF MOLDING BI-CELLULAR THERMOELECTRIC COUPLES

Filed Dec. 26, 1961

*INVENTORS*
CLARENCE A. BOYCE, JR.
*BY* MICHAEL E. WASILISIN

Seghrue, Rothwell, Mion & Zinn
*ATTORNEYS*

United States Patent Office 3,287,473 Patented Nov. 22, 1966

3,287,473

METHOD OF MOLDING BI-CELLULAR THERMOELECTRIC COUPLES

Clarence A. Boyce, Jr., and Michael E. Wasilisin, Baltimore, Md., assignors to Martin-Marietta Corporation, Baltimore, Md., a corporation of Maryland Filed Dec. 26, 1961, Ser. No. 161,994
4 Claims. (Cl. 264—25)

This invention relates to thermoelectric couples and more particularly to a bi-cellular thermoelectric couple which is fabricated in a single casting operation.

Thermoelectric couples are devices which operate under a phenomenon known as Peltier effect. Whenever two dissimilar conductors come in contact there is a difference of electrical potential and it their opposite ends are joined and the two junctions maintained at different temperatures, an electric current will be produced in the circuit thus formed. Such devices have been found extremely advantageous for use in power supply systems for space, marine and land applications. Electric generators utilizing this phenomenon are completely static in nature and eliminate a great many of the difficulties inherent in the use of conventional electric generators employing moving parts. At the same time, thermoelectric generators of this type may be used over extensive time periods with low maintenance requirements.

Thermoelectric couples in general use today are constructed of semiconductor material such as a lead-telluride composition including suitable doping agents to produce the individual dissimilar thermoelectric elements required to form the couple. A single thermoelectric couple comprises a "P" (+) and "N" (−) element, connected electrically in series through a common conductive material such as a metallic electrode. The thermoelectric elements are affixed to one surface of the common electrode and extend away from the electrode in parallel planes. A complete thermoelectric generator consists of a great number of these individual thermoelectric couples connected electrically in series or in series parallel to meet output power requirements.

The present known techniques for producing thermoelectric couples are relatively complicated including the requirement of preliminarily manufacturing the "P" and "N" semi-conductor elements individually in ingot form to a shape roughly equivalent to that used in the final assembly and of fusing each of the elements individually to the common conductive member or electrode. Prior to the fusing operation, the individual "P" and "N" ingots are generally machined to a desired shape. The electrode face to which the elements are coupled must mechanically and chemically be cleaned to insure a subsequent low resistance bond between the individual thermoelectric elements and the common electrode face. Subsequent to this assembly, suitable means are provided for soldering the electrical pick-up leads to the opposite or cold face of the thermoelectric couple.

Although this technique is successful in joining the semi-conductor elements to the metallic electrode faces, it is an extremely costly and time consuming operation requiring both the need of specialized tooling and great expenditure of labor. At the present time, therefore, while thermoelectric couples provide a means for generating electrical current in a completely static manner, the cost of such manufacture precludes the universal use of such devices.

It is therefore a primary object of this invention to provide a method of manufacturing a thermoelectric couple employing semi-conductor elements in which the couple is fabricated in a single casting operation.

It is a further object of this invention to provide an improved method of manufacturing a thermoelectric couple in which the need for preliminary casting of the individual "P" and "N" type elements is eliminated.

It is a further object of this invention to provide an improved method of manufacturing a thermoelectric couple of the semi-conductor type in which the need for metal plating of the common electrode surface prior to bonding of the individual semi-conductor elements thereto is eliminated.

It is a further object of this invention to provide an improved thermoelectric element in which the individual dissimilar semi-conductor elements are bonded to the common electrode during the casting operation.

It is a further object of this invention to provide an improved thermoelectric couple of the semi-conductor type which is more compact, resulting in a reduction in cost, has greater shock resistance and improved electrical efficiency.

Other objects of this invention will be pointed out in the following detailed description in the claims and illustrated in the accompanying drawing which discloses, by way of example, the principle of this invention, and the best modes which have been contemplated of applying that principle.

In the drawings:

FIGURE 1*a* is a perspective view of a basic thermoelectric couple as manufactured by a prior art method;

FIGURE 1*b* is a sectional, elevational view of a crucible in which a thermoelectric element has been molded for subsequent use in forming the couple of FIGURE 1*a*;

FIGURE 1*c* is an exploded, elevational view of the ingot formed in the apparatus of FIGURE 1*b* showing the terminal portions removed;

FIGURE 1*d* is an exploded, perspective view of the elements forming the thermoelectric couple of FIGURE 1*a*;

Briefly, the present invention provides a method of manufacturing a compact bi-cellular thermoelectric couple in a single casting operation in which a pair of spaced, dissimilar semi-conductor elements are integrally bonded to a common metal electrode forming the hot face or electrode of the couple. Insulating material in the form of a sleeve or sleeves is positioned adjacent the surface of the electrode forming the hot face of the couple with the sleeves and the electrode forming two separate chambers. The two chambers are filled with dissimilar thermoelectric composition materials and the assembly is positioned within an induction heating coil whereby the high frequency electrical current melts the individual thermoelectric compositions within the chambers and bonds these materials to the surface of the electrode. The assembly is removed slowly from the heating coil with the thermoelectric materials solidifying outwardly from the electrode within the insulating sleeve with the impurities segregated in the upper portion of the completed couple. The extreme upper portions of the individual thermoelectric elements carrying the impurities are removed.

In one embodiment of the invention, a pair of spaced cylindrical insulating sleeves are positioned coaxially on a common metal hot face. In other embodiments, a single sleeve having a septum is positioned on the common electrode to define the two separate chambers for receiving the dissimilar thermoelectric materials.

Figures 1A, 1B, 1C, 1D:
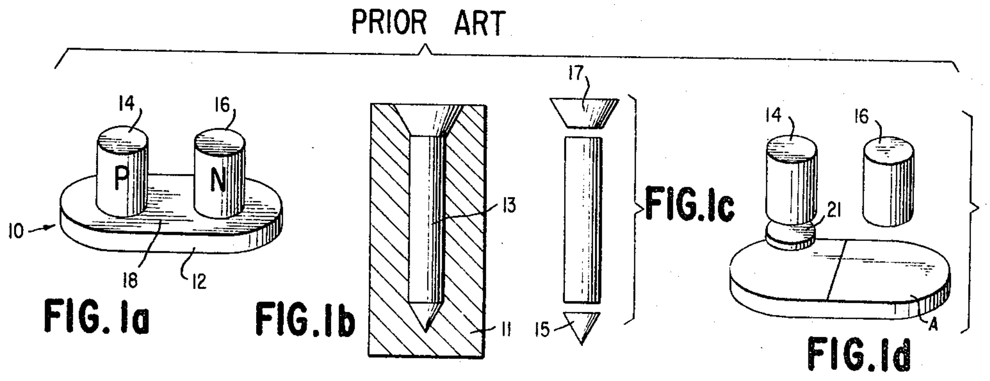

Referring now to the drawings, there is shown in FIGURE 1*a* basic thermoelectric couple consisting of a common electrode 12 in the form of a thin plate having an upper surface 18. A pair of dissimilar thermoelectric semi-conductor materials in the form of cylinders 14 and 16 are bonded to the upper surface 18 of the electrode 12. One cylindrical element 14 is provided with doping materials of a type to effect formation of a "P" type semi-conductor and the other cylindrical element 16 having doping material of a type providing a "N" type semi-conductor element. For the purposes of the present invention, the semi-conductor thermoelectric elements may be considered to be formed of suitable composition of lead and tellurium with each of the elements including the required doping agents to give the elements either "P" or "N" type characteristics as desired; however, any suitable semi-conductor material may be used.

In constructing a thermoelectric couple of this type, the prior art methods have been exceedingly complex and required extensive expenditure of time and effort. Conventionally, each of the "P" and "N" type thermoelectric elements are constructed in ingot form by first pulverizing the lead and tellurium material and the doping elements, placing the elements in a suitable crucible 11, FIGURE 1*b* and heating the crucible to effect the formation of a suitable ingot 13. After ingot 13 cools, it is necessary to machine the surfaces of the ingot to effect the desired configuration and to remove a portion of the ingot containing impurities. Ends 15 and 17 are removed as shown in FIGURE 1*c*. In order to secure each of the semi-conductor elements to the common electrode or hot face to effect both a good mechanical connection as well as one in which the electrical resistance is a minimum, it has been necessary to plate the metallic electrode. Conventionally, the electrode 12 is formed of an iron alloy. Since iron oxide has a relatively high resistance, it is necessary to clean the surface of the iron hot face and to prevent the formation of oxide during the bonding operation. Also, as shown in FIGURE 1*d*, to effect a suitable bond between the thermoelectric elements and the common hot face surface, it is necessary to first place the iron hot face surface, in the area indicated at A where the "N" element contacts the surface with a thin metal coating. Nickel plating has been found satisfactory, and a typical operation required to place the hot face in condition for receiving the bond, includes the following operations:

(1) Wipe with suitable solvent such as trichloroethylene.
(2) Mask off the area not to be plated.
(3) Immersion dipped in hydrochloric acid.
(4) Rinse in alcohol and water.
(5) Polish with pumice.
(6) Rinse in alcohol and water.
(7) Nickel plate.
(8) Rinse.
(9) Remove masking.
(10) Dip in hydrochloric acid.

(11) Rinse.
(12) Polish with pumice on the non-plated side.
(13) Rinse.
(14) Dip in alcohol.
(15) Place in forced air, oven dry and place in desiccator.

In a typical example, it requires forty-two minutes to complete the entire operation outlined above for each hot face detail.

Subsequent to the preliminary plating operation, the prior art method of manufacturing thermoelectric couples requires the individually cast "P" and "N" thermoelectric element to be bonded individually to the hot face in an inert atmosphere, such as argon and hydrogen. A GeTe wafer 21 is required between the elements 14, 16 and the plated base member 12. At the same time, since the dissimilar thermoelectric elements are formed individually (normally cylindrical), the physical configuration of these elements prevents the formation of a compact thermoelectric couple, since the individual elements must be electrically and mechanically spaced from each other.

The present invention provides an extremely advantageous method of forming a highly compact bi-cellular thermoelectric couple in which the pair of spaced, dissimilar thermoelectric elements are cast and integrally bonded to the common "hot face" electrode and in which the need for a great many preliminary operations including the step of nickel plating the electrode surfaces is completely eliminated.

Figure 2:
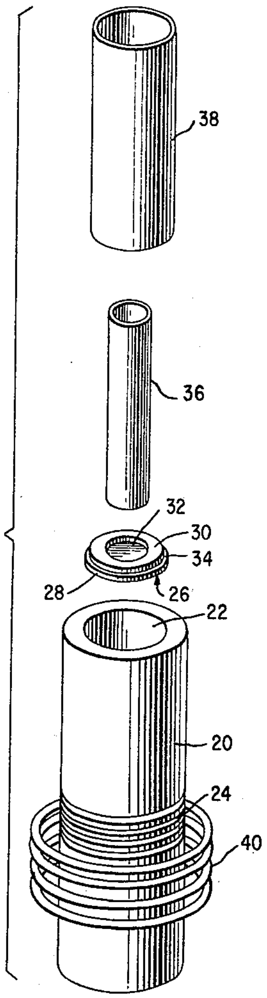
FIGURE 2 is an exploded, perspective view of the novel construction of the thermoelectric couple and its relation to an induction heating apparatus for casting and bonding dissimilar semi-conductive materials to a common electrode under the method of the present invention.

Referring to FIGURE 2, there is shown in one form the elements necessary to form the compact thermoelectric couple by the methods of the present invention. A generally cylindrical graphite crucible 20 includes a central board 22 which is closed at its lower end and acts to receive the element forming the thermoelectric couple. A plurality of cooling fins 24 are provided along the outer surfaces to effect a desired cooling rate as will be explained in detail. In order to produce a bi-cellular thermoelectric couple, there is provided a metallic base member 26 which forms the hot face or common electrode for the couple. Element 26 includes a base portion 28 in the form of a thin disc having a diameter generally equal to the diameter of bore 22 of the graphite crucible. A raised annular portion 30 is formed integrally with base portion 28 having an outer diameter which is slightly less than the diameter of the base 28. The annulus 30 acts to forms a recess 32 centrally of the electrode and an outer rim 34. Associated with the common electrode of hot face 26 is a pair of insulating concentric sleeve members 36 and 38, the inner sleeve member 36 being positioned within the recess 32 while the outer sleeve member is positioned adjacent annulus 30 on rim 34. The inner and outer sleeve members may be formed of boron nitride, or from a material which is known as "lava" in the trade. Lava is a hydrous magnesium silicate (talc).

With the inner and outer insulative sleeves 36 and 38 positioned on the iron hot face 26, this assembly is positioned within the graphite crucible. The next step in the manufacture of the thermoelectric couple comprises the placement of suitable dissimilar thermoelectric materials within the separate chambers formed by positioning the sleeves on the iron hot face. For instance, assuming that it is desired to have a completed couple in which the inner element is a "P" type semi-conductor and the outer element is an "N" type semi-conductor, the cavity between the inner lava sleeve 36 and the outer lava sleeve 38 is filled with an "N" type lead telluride powder while the inner lava sleeve 36 is completely filled with a "P" type lead telluride powder. Thus, the complete bi-cellular couple is fabricated with raw materials in a single casting operation in lieu of the extensive manufacturing steps as outlined above required for the prior art thermoelectric couples.

For example, a bi-cellular thermoelectric couple of the type shown in FIGURE 2 may be manufactured by taking a suitably formed iron "hot face" and subjecting it to the simplified steps of (1) wiping the upper face with a suitable solvent; (2) polishing the face with pumice; (3) dipping the element in alcohol; and (4) placing it in a desiccator. This preliminary operation requires only five minutes per hot face detail rather than the forty-two minutes required per hot face detail under the prior art method. The iron hot face 26 is next placed in the bore 22 of the graphite crucible and preheated to 1700° F. for one minute. This operation is required to outgas the iron shoe and to clean the surfaces with a reducing atmosphere. The insulating sleeves are next placed in position respectively on the iron hot face 26 on either side of the annulus 30. Dissimilar thermoelectric components are loaded in the two separated chambers and a suitable graphite cover (not shown) is placed over bore 22. The praphite crucible is then inserted upwardly into the induction heating coil 40, FIGURE 2. The crucible and the bi-cellular couple are heated at 1900° F. and held for a period of two minutes. During this time, the magnetic flux from the high frequency induction heating unit 40 causes the liquified lead-telluride mixtures within the chambers of the thermoelectric couple to mix thoroughly. The graphite cover acts to prevent the loss of the constituents during the heating and stirring portion of the cycle. After a two-minute dwell time, the crucible is then slowly lowered from the induction load coil 40 at a drop rate of 1" per minute. The lowering of the crucible from the induction coil 40 and the provision of the suitably located cooling fins 32 on the outer surfaces of the graphite crucible causes the solidification of the lead tellurides within the chambers. The solidification occurs from the bottom to the top of the thermoelectric couple, thus causing the impurities to remain within the molten portion and to solidify at the top of the cast.

Figure 4:
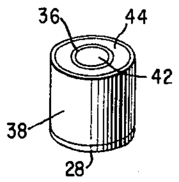
FIGURE 4 is a perspective view of the completed thermoelectric couple forming the first embodiment of this invention.

It is apparent, therefore, from this example that the method of the present invention insures the production of a highly compact thermoelectric couple of extreme homogeneous composition having improved electrical qualities providing good electrical connection between the thermoelectric elements and the common hot face electrode. The completed bi-cellular thermoelectric couple is subsequently removed from the crucible after solidification, the upper portion of the element is machined to remove that portion carrying the impurities and a completed couple as shown in FIGURE 4 is thereby produced, ready for receiving the suitable electrical connections to the end opposite the hot face 26. The portion of the completed thermoelectric couple which is viewed after the manufacturing process has been completed, is the thin disc sheet base portion 28 of the iron hot face, the outer insulated lava sleeve 38, the end of the inner lava sleeve 36 and the exposed surface of the "P" type thermoelectric element 42 and the "N" type 44.

Figure 3:
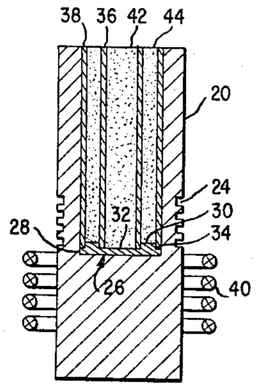
FIGURE 3 is a sectional, elevational view of the elements shown in FIGURE 2.
Figure 5:
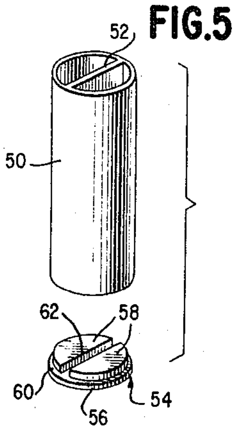
FIGURE 5 is an exploded, perspective view of a thermoelectric couple forming another embodiment of the present invention.
Figure 6:
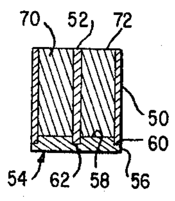
FIGURE 6 is a sectional, elevational view of the completed thermoelectric couple of FIGURE 5.

It is not necessary to use a pair of concentric insulating cylinders in contact with a common electrode to form a bi-cellular thermoelectric couple. Other configurations are envisioned as being completely satisfactory, the only requirement is the need of an insulative member which acts in conjunction with the common electrode to form a pair of separate chambers for receiving unlike thermoelectric materials. For instance, referring to FIGURE 5, there is shown a single insulative sleeve 50 which includes a common dividing wall or septum 52 which divides the cylinder into two cavities or chambers. Associated with cylinder 50 is a common electrode or hot face 54, which, like the iron hot face of FIGURE 2 includes a base portion or disc 56 and a split upper disc 58. The split upper disc 58 is of smaller diameter than the base to form rim 60 with groove 62 acting to receive the septum 52 when the sleeve 50 is positioned on the common electrode. The apparatus and method for forming the bicellular thermoelectric couple of FIGURE 3 by the single step casting and bonding technique is identical with that used in the formation of the embodiment of FIGURE 2. After positioning the sleeve 50 on the base or iron hot face 54, the elements are positioned within bore 22 of the crucible 20 and a like casting technique is provided in which the graphite crucible is moved relative to induction coil 40 to effect a timed heating and cooling operation. The completed thermoelectric couple of this embodiment is shown in FIGURE 6. In this case, rather than having the thermoelectric element portions of the couple concentrically positioned, the elements 70 and 72 are positioned side by side on the common electrode or hot face 54.

Figure 7:
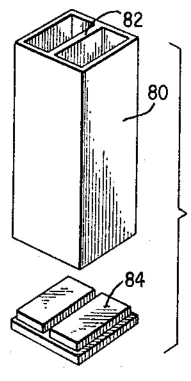
FIGURE 7 is an exploded, perspective view of the elements used in the production of a thermoelectric couple forming yet another embodiment of the present invention.
Figure 8:
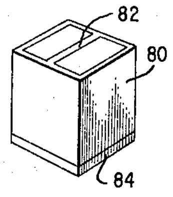
FIGURE 8 is a perspective view of a completed thermoelectric element in a thermoelectric couple using the elements shown in FIGURE 7.

While the sleeves associated with the illustrated embodiments are cylindrical in form, sleeves having other configurations are envisioned by the inventor. For instance, in FIGURE 7 there is shown a rectangular sleeve 80 having a central septum 82 adapted to be positioned upon a rectangular iron hot face 84. This configuration may be used with the distinct advantage of allowing a maximum number of thermoelectric couples to be positioned within a given space. The completed thermoelectric couple having this configuration is shown by FIGURE 6. At the same time, instead of placing the lead-telluride powder in the confines of the thermoelectric bi-cellular sleeve of insulating material, a divided hopper may be installed above the graphite crucible and surrounded with a secondary induction heating load coil. This hopper then is filled with 100 mesh lead-telluride powder and pre-melted. After a two-minute pre-melt, the molten material is released into the pre-heated shell by means of the divided hopper such that each chamber receives its portion of dissimilar material. The manufacturing process then proceeds along the same manner as that of the previous embodiments. The drop rate controlling the solidification of the thermoelectric elements within the couple may be controlled by the appropriate selection and size of the cooling fins 24 associated with the graphite crucible, thus eliminating any piping. The major advantage of this technique is that any oxides present in the lead-telluride powder will have floated to the surface of the hopper melt and thus insuring that the liquid lead-telluride passing into the chambers of the thermoelectric couple will be oxygen-free effecting a homogeneous final cast.

While there have been shown, described and pointed out the fundamental novel features of the invention as applied to a preferred embodiment, it will be understood that various omissions and substitutions and changes in the form and details of the device illustrated and in this operation may be made by those skilled in the art without departing from the spirit of the invention. It is the intention, therefore, to be limited only as indicated by the scope of the following claims.

What is claimed is:

1. A method of forming a bi-cellular thermoelectric couple in a single casting operation comprising the steps of; positioning insulation means on a metallic base member to form a pair of separate chambers therewith, placing said assembly within a crucible, depositing dissimilar thermoelectric materials in powdered form in respective chambers, subjecting said crucible to a high frequency induction field to effect a melting of said materials, holding said materials above their melting temperature for a period of time sufficient to permit the magnetic flux of the induction heating to effect a completely homogeneous mixing of the constituent elements thereof, and moving said crucible relative to said field to effect cooling of said thermoelectric materials from said common base member outwardly to cause said thermoelectric materials to bond to said base member and the impurities to segregate to the portion of said thermoelectric material remote from said base member.

2. A method of forming a bi-cellular thermoelectric couple in a single casting operation comprising the steps of; positioning at least one sleeve member of insulation material on a metallic base member to form a pair of separate chambers therewith, depositing dissimilar thermoelectric materials in powdered form in respective chambers, placing said assembly within a crucible and subjecting said crucible to a high frequency induction field to effect a melting, of said dissimilar thermoelectric materials, holding said dissimilar thermoelectric materials above their melting temperature for a period of time sufficient to permit the magnetic flux of the induction heating to effect a completely homogeneous mixing of the constituent elements thereof and moving said crucible relative to said induction field to effect cooling of said thermoelectric materials from said common base member outwardly to cause said thermoelectric material to bond to said base member and the impurities to segregate in a portion of said thermoelectrical material remote from said base member.

3. A method of forming a bi-cellular thermoelectric couple in a single casting operation employing a crucible positioned within an induction coil comprising the steps of; placing a metallic base member within said crucible, placing at least one hollow sleeve member of insulative material on said base member to form a pair of separate chambers therewith, depositing dissimilar thermoelectric materials in powdered form in respective chambers, energizing said induction coil with high frequency current to effect a melting of said thermoelectric material, holding said thermoelectric materials above their melting temperatures for a period of time sufficient to permit the magnetic flux of the induction heating to effect a completely homogeneous mixing of the constituent elements thereof and moving said crucible relative to said induction coil to cause solidification of said thermoelectric materials from said common base member outwardly whereby said thermoelectric materials are bonded to said base member and the impurities in said thermoelectric materials are segregated in the portion of said thermoelectric material remote from said base member.

4. A method of forming a thermoelectric couple comprising the steps of positioning insulation means on a metallic base member to form a pair of chambers therewith, placing the resulting assembly within a crucible, depositing thermoelectric materials in powdered form in said chambers, heating said crucible to effect a melting of said materials, and moving said crucible relative to the heat source to cause solidification of said thermoelectric materials from said base member outwardly whereby said thermoelectric materials are bonded to said base member and the impurities in said thermoelectric materials are segregated in the portion of said thermoelectric materials remote from said base member.

References Cited by the Examiner

UNITED STATES PATENTS

| | | | |
|---|---|---|---|
| 713,652 | 11/1902 | Kitsee | 136—5 |
| 1,804,072 | 5/1931 | Turrettini | 136—4.2 |
| 1,848,655 | 3/1932 | Petrik | 136—4.2 |
| 2,186,707 | 1/1940 | Ray | 136—4.76 |
| 2,289,152 | 7/1942 | Telkes | 136—5 |
| 2,801,192 | 7/1957 | Overby | 75—10 X |
| 2,997,514 | 8/1961 | Roeder | 136—4.2 |
| 3,017,446 | 1/1962 | Goldsmid | 136—5 |

WINSTON A. DOUGLAS, *Primary Examiner.*

JOHN H. MACK, *Examiner.*

J. BARNEY, A. B. CURTIS, *Assistant Examiners.*